United States Patent
Poplavskyy et al.

(10) Patent No.: US 8,273,669 B2
(45) Date of Patent: Sep. 25, 2012

(54) METHOD OF FORMING A PASSIVATED DENSIFIED NANOPARTICLE THIN FILM ON A SUBSTRATE

(75) Inventors: Dmitry Poplavskyy, San Jose, CA (US); Maxim Kelman, Mountain View, CA (US); Mason Terry, Redwood City, CA (US)

(73) Assignee: Innovalight, Inc., Sunnyvale, CA (US)

( * ) Notice: Subject to any disclaimer, the term of this patent is extended or adjusted under 35 U.S.C. 154(b) by 43 days.

(21) Appl. No.: 12/926,252

(22) Filed: Nov. 4, 2010

(65) Prior Publication Data
US 2011/0053352 A1 Mar. 3, 2011

Related U.S. Application Data

(62) Division of application No. 12/047,824, filed on Mar. 13, 2008, now Pat. No. 7,851,336.

(51) Int. Cl.
*H01L 21/471* (2006.01)
(52) U.S. Cl. ............... 438/791; 438/958; 257/E21.464; 977/892
(58) Field of Classification Search .............. 438/502, 438/962; 257/E21.115, E21.116, E21.464; 977/779, 892, 901
See application file for complete search history.

(56) References Cited

U.S. PATENT DOCUMENTS

| | | | |
|---|---|---|---|
| 4,040,849 A | 8/1977 | Greskovich et al. |
| 4,262,631 A | 4/1981 | Kubacki |
| 4,330,358 A | 5/1982 | Grabmaier et al. |
| 4,407,858 A | 10/1983 | Hanke et al. |
| 4,876,219 A | 10/1989 | Pessa et al. |
| 4,910,167 A | 3/1990 | Lee et al. |
| 5,057,163 A | 10/1991 | Barnett et al. |
| 5,141,893 A | 8/1992 | Ito et al. |
| 5,262,357 A | 11/1993 | Alivisatos et al. |
| 5,336,335 A | 8/1994 | Hall et al. |
| 5,556,791 A | 9/1996 | Stevens et al. |
| 5,576,248 A | 11/1996 | Goldstein |
| RE36,156 E | 3/1999 | Hall et al. |
| 6,080,606 A | 6/2000 | Gleskova et al. |
| 6,111,191 A | 8/2000 | Hall et al. |

(Continued)

FOREIGN PATENT DOCUMENTS

DE 199 04 082 8/2000

(Continued)

OTHER PUBLICATIONS

Christiansen, T. et al., "Standard Operating Procedure: Spin-on-Glass Surface Level Characterization," Jun. 8, 2000, 7 pages.

(Continued)

*Primary Examiner* — Stephen W Smoot
(74) *Attorney, Agent, or Firm* — Foley & Lardner LLP

(57) ABSTRACT

A method for forming a passivated densified nanoparticle thin film on a substrate in a chamber is disclosed. The method includes depositing a nanoparticle ink on a first region on the substrate, the nanoparticle ink including a set of Group IV semiconductor particles and a solvent. The method also includes heating the nanoparticle ink to a first temperature between about 30° C. and about 400° C., and for a first time period between about 1 minute and about 60 minutes, wherein the solvent is substantially removed, and a porous compact is formed. The method further includes flowing an oxidizer gas into the chamber; and heating the porous compact to a second temperature between about 600° C. and about 1000° C., and for a second time period of between about 5 seconds and about 1 hour; wherein the passivated densified nanoparticle thin film is formed.

7 Claims, 12 Drawing Sheets

U.S. PATENT DOCUMENTS

| | | | |
|---|---|---|---|
| 6,559,479 | B1 | 5/2003 | Lüdemann |
| 6,878,871 | B2 | 4/2005 | Scher et al. |
| 6,984,265 | B1 | 1/2006 | Raguse et al. |
| 7,521,340 | B2 | 4/2009 | Lemmi et al. |
| 2002/0192956 | A1 | 12/2002 | Kizilyalli et al. |
| 2003/0003300 | A1 | 1/2003 | Korgel et al. |
| 2003/0226498 | A1 | 12/2003 | Alivisatos et al. |
| 2005/0008880 | A1 | 1/2005 | Kunze et al. |
| 2005/0104125 | A1 | 5/2005 | Sato et al. |
| 2005/0126628 | A1 | 6/2005 | Scher et al. |
| 2006/0051505 | A1 | 3/2006 | Kortshagen et al. |
| 2006/0154036 | A1 | 7/2006 | Kunze et al. |
| 2006/0237719 | A1 | 10/2006 | Colfer et al. |
| 2007/0218657 | A1 | 9/2007 | Bet et al. |
| 2008/0160265 | A1 | 7/2008 | Hieslmeir et al. |
| 2008/0160733 | A1 | 7/2008 | Hieslmeir et al. |

FOREIGN PATENT DOCUMENTS

| | | |
|---|---|---|
| EP | 1551057 A | 7/2005 |
| EP | 1892753 | 2/2008 |
| GB | 1048564 A | 11/1966 |
| GB | 1077224 A | 7/1967 |
| JP | 2005/332913 A2 | 12/2005 |
| WO | WO 99/50890 | 10/1999 |
| WO | WO 2004/023527 | 3/2004 |
| WO | WO 2004/068536 A2 | 8/2004 |
| WO | WO 2006/096201 | 9/2006 |
| WO | WO 2008/039757 | 4/2008 |
| WO | WO 2008/073763 | 6/2008 |
| WO | WO 2008/076744 | 6/2008 |

OTHER PUBLICATIONS

Jang, W.I. et al., "Fabrication of MEMS Devices by Using Anhydrous HF Gas-phase Etching with Alcoholic Vapor" J. Micromech. Microeng., vol. 12, 2002, pp. 297-306; published by IOP Publishing Ltd.

Kubacki, R. M., "Low Temperature Plasma Deposition of Silicon Nitride to Produce Ultra-Reliable, High Performance, Low Cost Sealed Chip-on-Board (SCOB) Assemblies," *IEEE Transactions on Components, Packaging, and Manufacturing Technology—Part A*, vol. 18, No. 3, Sep. 1995 pp. 471-477.

Lee, J.H. et al, "Gas-Phase Etching of Sacrificial Oxides Using Anhydrous HF and $CH_3OH$," $10^{th}$ Annual Internat'l Workshop on MEMS, *IEEE*, Jan. 26-30, 1997, pp. 448-453.

Orfert, M. et al., "Plasma Enhanced Chemical Vapor Deposition of SiN-films for Passivation of Three-Dimensional Substrates" *Surface and Coatings Technology*, 116-119, 1999, pp. 622-628; published by Elsevier Science S.A.

Schmid, P. et al, "Plasma deposition of Si-N and Si-O passivation layers on three-dimensional sensor devices," *Surface and Coatings Technology*,98, 1998, pp. 1510-1517; published by Elsevier Science S.A.

Ai et al., "Preparation and characterization of Si sheets by renewed SSP technique," *Journal of Crystal Growth*, vol. 270 (2004), pp. 446-454.

Q. Ban et al., "Substrate Materials for Poly-CSiTF Solar Cells: Optimization of Silicon Sheet from Powder", *Acta Metallurgica Sinica*, vol. 18, No. 3 (Jun. 2005), pp. 184-188.

Q. Ban et al., "Study on Preparation Technology of Polycrystalline Silicon Thin Film Solar Cells Based on SSP Substrate", *Acta Energiae Solaris Sinica*, vol. 25, No. 1 (Feb. 2004), pp. 95-98.

Bet et al., "Laser Forming of Silicon Films Using Nanoparticle Precursor," *Journal of Electronic Materials*, vol. 35, No. 5 (2006), pp. 993-1004.

Britton, D.T. and M. Härting, "Printed Nanoparticulate Composites for Silicon Thick Film Electronics," *Pure and Applied Chemistry*, vol. 78, No. 9 (2006), 1723-1739.

Ghosh et al., "Theory of the electrical and photovoltaic properties of polycrystalline silicon," *Journal of Applied Physics*, vol. 51, No. 1 (1980) pp. 446-454.

Grovenor, C. R. M., "Grain boundaries in semiconductors," *J. Phys. C: Solid State Phys.*, vol. 18 (1985), pp. 4079-4119.

Liang et al, "Characterisation of direct epitaxial silicon thin film solar cells on a low-cost substrate," *Solar Energy Materials & Solar Cells*, vol. 80 (2003), pp. 181-193.

Mataré, H. F., "Carrier transport at grain boundaries in semiconductors," *Journal of Applied Physics*, vol. 56, No. 10 (1984), pp. 2605-2631.

McCann et al, "A Review of Thin Film Crystalline Silicon for Solar Cell Applications. Part 1: Native Substrates," *Solar Energy Materials and Solar Cells*, vol. 68, No. 2 (May 2001), pp. 135-171.

Möller et al., "Sintering of Ultrafine Silicon Powder," *Journal of the American Ceramic Society*, vol. 68, No. 6 (1985), pp. 320-325.

Yang et al., "Effect of pressure on melting temperature of silicon," *Journal of Physics: Condensed Matter*, vol. 15 (2003), pp. 4961-4965.

"Crystalline Silicon Thin-Film Solar Cells," a Product Information Sheet published by Fraunhofer Institut Solare Energie Systeme, Oct. 2001, pp. 1-6.

D. V. Melnikov et al., "Quantum Confinement in Phosphorus-Doped Silicon Nanocrystals," *Physical Review Letters*, vol. 92 (2004), pp. 046802-1-046802-4.

Y. H. Tang et al., "Microstructure and Filed-Emission Characteristics of Boron-Doped SI Nanoparticle Chains," *Applied Physics Letters*, vol. 79 (2001), pp. 1673-1675.

T. Ifuku et al., "Fabrication of Nanocrystalline Silicon with Small Spread of Particle Size by Pulsed Gas Plasma," *Jpn. J. Appl. Phys.*, vol. 36, Part 1, No. 6B, (Jun. 1997), pp. 4031-4034.

A. N. Goldstein, "The Melting of Silicon Nanocrystals: Submicron Thin-film Structures Derived from Nanocrystal Precursors," *Applied Physics A*, vol. 62 (1996), pp. 33-37.

T. Shiga et al., "Photovoltaic performance and stability of CdTe/polymeric hybrid solar cells using a C60 buffer layer," *Solar Energy Materials and Solar Cells*, vol. 90, No. 12, (Jan. 2006), pp. 1849-1858; published by Elsevier Science Publishers, Amsterdam, NL.

J. R. Heath et al., "Nanocrystal Seeding: A low temperature route to polycrystalline Si films," *Applied Phys. Lett.* vol. 64, No. 26, Jun. 27, 1994, pp. 3569-3571.

G. Samdani et al., "Tiny Particles Aim for Big Markets," *Chemical Eng.*, Aug. 1994, pp. 35-39.

A. N. Goldstein et al., "Melting in Semiconductor Nanocrystals," *Science*, vol. 256, No. 5062, Jun. 5, 1992, pp. 1425-1427.

Ph. Buffet et al., "Size Effect on the Melting Temperature of Gold Particles," *Physical Review A*, vol. 13, No. 6, Jun. 1976.

F. Ercolessi et al., "Melting of Small Gold Particles: Mechanism and Size Effects," *Physical Review Letters*, vol. 66, No. 7, Feb. 18, 1991, pp. 911-914; published by the American Physical Society.

M. Wautelet, "Estimation of the variation of the melting temperature with the size of small particles, on the basis of a surface-phonon instability model,:" *J. Phys. D: Appl Phys*, vol. 24 (1991), pp. 343-346; published by IOP Publishing Ltd.

R. S. Berry et al., "Melting of Clusters and Melting," *Physical Review A*, vol. 30, No. 2, Aug. 1984; published by the American Physical Society.

International Search Report for PCT/US2007/070134, mailed Aug. 11, 2008.

International Search Report for PCT/US2007/076549, mailed Jul. 25, 2008.

International Search Report for PCT/US2007/086432, mailed May 28, 2008.

International Search Report for PCT/US2007/086376, mailed May 28, 2008.

International Search Report for PCT/US2007/087205, mailed May 28, 2008.

International Search Report for PCT/US2008/059038, mailed Jul. 18, 2008.

International Search Report for PCT/US2007/077765, mailed Feb. 1, 2008.

International Search Report for PCT/IB2004/000221 (WO 2004/068536 A2), mailed Aug. 30, 2004.

International Search Report and Written Opinion for PCT/US2008/059118 dated Mar. 5, 2009.

METHOD OF FORMING A PASSIVATED DENSIFIED NANOPARTICLE THIN FILM ON A SUBSTRATE

CROSS-REFERENCE TO RELATED APPLICATIONS

This application is a Divisional of U.S. application Ser. No. 12/047,824, filed Mar. 13, 2008, which issued as U.S. Pat. No. 7,851,336 on Dec. 14, 2010.

FIELD OF DISCLOSURE

This disclosure relates in general to semiconductor passivation, and in particular to methods of surface passivation using Group IV semiconductor nanoparticles.

BACKGROUND

Semiconductors form the basis of modern electronics. Possessing physical properties that can be selectively modified and controlled between conduction and insulation, semiconductors are essential in most modern electrical devices (e.g., computers, cellular phones, photovoltaic cells, etc.). Group IV semiconductors generally refer to those elements in the fourth column of the periodic table (e.g., carbon, silicon, germanium, etc.).

In general, a solid semiconductor tends to exist in three forms: crystalline, polycrystalline, and amorphous. In crystalline form, semiconductor atoms are positioned in a single unbroken crystal lattice with no grain boundaries. In polycrystalline form, the semiconductor atoms are positioned in many smaller and randomly oriented crystallites (smaller crystals). The crystallites are often referred to as grains. In amorphous form, the semiconductor atoms show no long-range positional order.

In general, conduction generally refers to the movement of electrically charged carriers, such as electrons or holes (i.e., lack of electrons), through electromagnetic fields. Metals tend to have substantial amounts of electrically charged particles available, whereas insulators have very few.

In the absence of impurities (called dopants), a semiconductor tends to behave as insulator, inhibiting the flow of an electric current. However, after the addition of relatively small amounts of dopants, the electrical characteristics of a semiconductor can dramatically change to a conductor by increasing the amount of electrically charged carriers. For example, in a process called photoexcitation, absorbed light will generally create an electron-hole pair (photocarriers) that in turn tends to increase overall conductivity (photoconductivity).

Depending on the kind of impurity, a doped region of a semiconductor can have more electrons (n-type) or more holes (p-type). For example, in a common configuration, a p-type region is placed next to an n-type region in order to create a (p-n) junction with a "built-in" potential. That is, the energy difference between the two Fermi levels.

Under generally accepted principles of quantum mechanics, electrons of an atom can only reside in certain states, so that only particular energy levels are possible. However, the occupation of particular energy states cannot be determined with particularity. Consequently, for an ensemble of atoms (e.g., solid) a probability distribution or density is commonly used, which for electrons is called the Fermi distribution. In general, the Fermi level describes the energy level at a given temperature in which ½ of the energy states are filled. Energy states are unique and correspond to a quantum number.

Consequently, electrons on the p-type side of the junction within the electric field may then be attracted to the n-type region and repelled from the p-type region, whereas holes within the electric field on the n-type side of the junction may then be attracted to the p-type region and repelled from the n-type region. Generally, the n-type region and/or the p-type region can each respectively be comprised of varying levels of relative dopant concentration (often shown as n−, n+, n++, p−, p+, p++, etc.). The built-in potential and thus magnitude of electric field generally depend on the level of doping between two adjacent layers.

There are several methods that can be used to provide doped layers to form a p/n junction or a hi-lo (e.g., p+/p or n+/n) junction. One set of such methods involves providing a high dopant concentration at the wafer surface, and a subsequent high temperature step (e.g., between about 800° C. and about 1000° C.) to diffuse dopants from the surface into the wafer. For example, the process can be performed in a dopant-containing ambient, such as e.g. $POCl_3$. Alternatively a dopant containing glass can be deposited on the wafer surface and then heated to a high temperature for the dopant diffusion to occur. Another method, which tends to be more expensive, is to implant the dopants using a high energy dopant ion beam followed by a quick high temperature annealing step to activate the dopant atoms. However, although dopant dosage may be controlled with high precision, ion implantation tends to be relatively expensive due to the use of specialized semiconductor manufacturing equipment.

Another approach to providing doped layers on silicon wafers is to deposit a doped silicon layer, typically using chemical-vapor-deposition (CVD) techniques, such as, e.g., conventional CVD, plasma-enhanced CVD (PECVD), or hot-wire CVD (HWCVD). Depending on the growth conditions, epitaxial, polycrystalline, or amorphous films can be grown. These approaches tend to be relatively expensive due to expensive vacuum equipment. Also, these methods tend to suffer from low deposition rates that are required to provide high quality films.

In addition, another problem associated with the listed approaches is the inability to easily pattern the deposited silicon film. The most straightforward way to provide patterns with the above approaches would be to use photolithography, which tends to be relatively expensive. Alternatively, screen printing of doped pastes can be used. However, in this process, the downward mechanical force of the printing squeegee also tends to subject the substrate to stress, and hence may detrimentally affect the electrical and physical characteristics of the substrate. For devices that require multiple deposition steps, such as a back contact solar cell, the stress is aggravated. In general, every additional screen printing step tends to reduce the process yield (and increase costs) due to damage or breakage. Additionally, alignment of the screen pattern may also present substantial challenges. For example, if pattern alignment is poor, the resulting solar cells may malfunction (e.g., short) further reducing process yield.

In addition to providing doped silicon layers, these layers as well as the silicon substrate have to be properly passivated in order to reduce recombination losses in the solar cell. Unpassivated surfaces contain a large number of unsaturated bonds which create deep energy levels that assist recombination of minority carriers in the semiconductor.

One of the widely used approaches for passivation of wafer surfaces is to deposit a film of dielectric (e.g., $SiO_2$, $SiN_x$, etc.), which may reduce the density of deep states at the interface and/or provide an electric field at that interface (see, e.g., A. Aberle, *Prog. Photovolt: Res. Appl.* 8, p. 473 (2000)).

In some examples described in prior art, processes of oxidation and nitridation have been used to passivate internal surfaces of porous silicon layers, which were prepared by conventional electrochemical anodization on heavily diffused silicon wafers, see e.g. L. Debarge et al, *Materials Science in Semiconductor Processing* 1, 281 (1998) and L. Stalmans et al, *Solar Energy Materials & Solar Cells* 58, 237 (1999).

In other examples, an approach for fabricating a heterojunction (an interface between two layers of dissimilar semiconductors) at an interface with an emitter, back surface field (BSF), and/or a contact, in order to reduce recombination at that interface is provided. Typically, using heterojunction interfaces with an additional energy barrier due to band offset between interfacing materials can reduce recombination at that interface (e.g., in a heterojunction with intrinsic thin-layer (HIT) cell). In certain embodiments, a nanoparticle material with silicon nanoparticles embedded into the matrix of an insulator (e.g., SiOx, SiOxNy, etc.) can be utilized. For example, by using Semi-Insulating Polysilicon (SIPOS) materials that have relatively high oxygen content, a band gap (e.g., 1.5 eV) wider than that of crystalline silicon, 1.12 eV, can be provided.

SIPOS materials are generally prepared by a variety of chemical vapor deposition (CVD) methods, and can include silicon nanocrystals embedded within a matrix of $SiO_2$. Such a structure may be doped to have high conductivity (e.g., $10^3$ S/cm), and with a larger band gap than silicon. For example, an open circuit voltage ($V_{oc}$) of about 720 mV can be achieved using SIPOS to form an emitter on a silicon wafer (see, e.g., E. Yablonovitch, et al, *Applied Physics Letters* 47(11), p. 1211 (1985)).

In view of the foregoing, there is desired a method of providing doped silicon layers with the passivating properties to form junctions and devices therefrom.

SUMMARY

The invention relates, in one embodiment to a method for forming a passivated densified nanoparticle thin film on a substrate in a chamber. The method includes depositing a nanoparticle ink on a first region on the substrate, the nanoparticle ink including a set of Group IV semiconductor particles and a solvent. The method also includes heating the nanoparticle ink to a first temperature between about 30° C. and about 400° C., and for a first time period between about 1 minute and about 60 minutes, wherein the solvent is substantially removed, and a porous compact is formed. The method further includes flowing an oxidizer gas into the chamber; and heating the porous compact to a second temperature between about 600° C. and about 1000° C., and for a second time period of between about 5 seconds and about 1 hour; wherein the passivated densified nanoparticle thin film is formed.

The invention relates, in another embodiment to a method for forming a passivated densified nanoparticle thin film on a substrate in a chamber. The method includes depositing a nanoparticle ink on a first region the substrate in an inert ambient, the nanoparticle ink including a set of Group IV semiconductor particles and a solvent. The method also includes heating the nanoparticle ink to a first temperature between about 30° C. and about 400° C., and for a first time period between about 1 minute and about 60 minutes, wherein the solvent is substantially removed, and a porous compact is formed. The method further includes flowing an oxidizer gas into the chamber; and heating the porous compact to a third temperature between about 600° C. and about 1000° C., and for a second time period of between about 5 seconds and about 1 hour; wherein the passivated densified nanoparticle thin film is formed.

The invention relates, in another embodiment to a method for forming a passivated densified nanoparticle thin film on a substrate in a chamber. The method includes depositing a nanoparticle ink on the substrate, the nanoparticle ink including a set of SiNx particles and a solvent. The method also includes heating the nanoparticle ink to a first temperature between about 30° C. and about 400° C., and for a first time period between about 1 minute and about 60 minutes, wherein the solvent is substantially removed, and a porous compact is formed. The method further includes heating the porous compact to a second temperature between about 600° C. and about 1000° C., and for a second time period of between about 5 seconds and about 1 hour; wherein the passivated densified nanoparticle thin film is formed.

The invention relates, in another embodiment to a method for forming a passivated densified nanoparticle thin film on a substrate. The method includes depositing a nanoparticle ink on a first region on the substrate in an inert ambient, the nanoparticle ink including a set of Group IV semiconductor particles and a solvent. The method also includes heating the nanoparticle ink to a first temperature between about 30° C. and about 400° C., and for a first time period between about 1 minute and about 60 minutes, wherein the solvent is substantially removed, and a porous compact is formed. The method further includes heating the porous compact to a second temperature between about 600° C. and about 1000° C., and for a second time period of between about 5 seconds and about 1 hour. The method also includes flowing a set of precursor gases into a chamber; and exposing the substrate to the set of precursor gases at a third temperature of between about 200° C. and about 1000° C., and for a third time period of between about 1 second and about 1 hour; wherein the passivated densified nanoparticle thin film is formed.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1A:
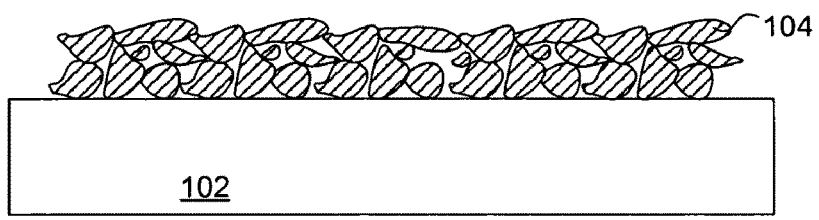
FIGS. 1A-B show cross-sections of exposed surfaces and oxidized passivation for a sintered porous nanoparticle film in accordance with embodiments of the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In an advantageous manner, junctions may be formed by using doped silicon layers formed from silicon nanoparticle inks on silicon wafers. The advantages of using silicon nanoparticle inks include, among others, the potential for low temperature processing, non-contact ink deposition, and easiness of providing patterned structures.

For example, one method of forming such junctions, as well as other details related to nanoparticle inks, are disclosed in U.S. patent application Ser. No. 12/029,838 filed Feb. 12, 2008, which is incorporated by reference. The process of producing nanoparticles, inks, film deposition and processing will be briefly described below.

In general, Group IV nanoparticles are produced during the plasma reaction, where decomposition of the Group IV precursor gas leads to formation of nanoparticles. Variations in the process conditions, such as process pressure, gas flows, plasma power, may be used to optimize nanoparticle properties, such as doping level, crystallinity and particle size.

Nanometer-size particles may be more readily suspended in a colloidal dispersion. The nanoparticles may be transferred into a colloidal solution in the desired ratio with respect to the solvent or solvent mixture. A number of subsequent processing steps, such as heating, ultrasonic agitation, or stirring, may be further applied to improve the properties of the colloidal ink.

Once formulated, the colloidal dispersion may be applied to a substrate and subjected to a heat treatment in order to sinter the Group IV nanoparticles into a densified conductive film. Examples of application methods include, but are not limited to, roll coating, slot die coating, gravure printing, flexographic drum printing, and ink jet printing methods, etc.

Generally, a number of heating steps may be used to dry the deposited nanoparticles films and sinter the nanoparticles together to densify the film and improve its electrical properties. The drying step may be performed at temperatures below about 400° C., while the sintering process can involve temperatures above about 400° C. In general, various heat sources may be used to sinter the nanoparticles, such as conventional contact thermal sources (e.g., resistive heaters, etc.), as well as radiative heat sources (e.g., lamps, lasers, microwave processing equipment, plasmas, tungsten-halogen, continuous arc lamps, flash lamps, etc.). In the case of lasers, a wavelength range of between about 0.3 microns and about 10 microns is generally optimal.

Silicon nanoparticle films, unless formed epitaxially on the wafer, tend to have high density of defects near the wafer/film interface that results in an increased recombination current across the interface, thus limiting the solar cell efficiency. Thus, passivating such interfaces in order to reduce recombination losses is desirable in a solar cell application. Lower recombination losses generally lead to increased solar cell performance, and in particular higher resultant voltages and currents.

Referring now to FIG. 1A (100A), a representative structure of the porous unpassivated nanocrystalline film is shown. A relatively strong interfacial recombination can occur at an interface between a wafer and a film, as well as inside the porous film, prepared from a deposited nanoparticle silicon ink. As shown in FIG. 1A (100A), some or all portions of the film (e.g., including silicon nanoparticles 104) may be left unpassivated or exposed on a surface of wafer 102 due to the porous nature of the film, likely leading to strong recombination on all unpassivated surfaces. This strong surface recombination may be due to formation of deep levels due to dangling bonds, distorted bonds, etc., on the surface. Accordingly, a passivation to protect the exposed surface in order to reduce recombination needs to be applied.

In an advantageous manner, an oxide shell may be formed on nanoparticle surfaces in a densified nanoparticle thin film, such that surfaces are substantially passivated and recombination losses are substantially reduced. Such structures can be used to form emitters, BSF layers, or contact layers in solar cells. In certain embodiments, a passivated film can be formed by: (i) printing or otherwise depositing silicon nanoparticle ink onto a wafer surface; (ii) sintering the ink to form a densified nanoparticle film; and (iii) controllably oxidizing the film (e.g., by thermal oxidation). In this approach, the particles in the nanoparticle ink may be doped using gas phase dopants prior to ink preparation. In this approach, oxidation may be performed after the sintering, may be done during, or even instead of sintering.

Figure 1B:
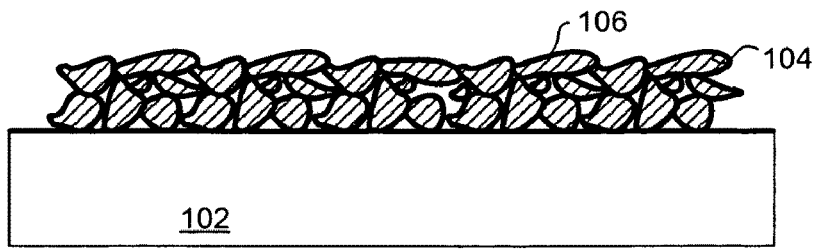

Referring now to FIG. 1B (100B), shown is a cross-section of a passivated sintered densified nanoparticle film in accordance with the present invention. As shown, exposed surfaces can be passivated by oxidation 106 because the sintered nanoparticle film are substantially permeable by gas. Thus, a gas-derived species (e.g., oxygen) can propagate down to the wafer surface to passivate any exposed areas of the surface by forming a dielectric (e.g., SiO$_2$, SiN$_x$, etc.).

Densified nanoparticle films may be deposited in several ways. For example, a nanoparticle ink (including a set of Group IV semiconductor particles and a solvent) may be deposited on a substrate. The nanoparticle ink may then be heated in an inert ambient such as argon or nitrogen to temperature between about 30° C. and about 400° C., and for a period between about 1 minute and about 60 minutes, in order to removed the remaining solvent and form a porous compact. The porous compact is then heated again to a temperature of between about 400° C. and about 1000° C., and for between about 1 second and about 1 hour, in order to sinter the nanoparticles and form the densified nanoparticle film.

In accordance with particular configurations, a relatively high-oxygen content nanoparticle film can be formed by sintering in the presence of an oxidizing gas environment, such as dry oxygen gas, wet oxygen gas, or any other suitable ambient, that can lead to oxidation. For example, suitable oxidation techniques are disclosed in U.S. patent application Ser. No. 11/950,024, filed Dec. 4, 2007, which is incorporated by reference.

Alternatively, chemical vapor deposition (CVD) may be used to grow a dielectric on the internal surfaces of the densified nanoparticle film. Typically, silicon oxide thin films can be grown using a silicon precursor such as silane, or tetraethoxy silane (TEOS) with an oxidizing agent such as oxygen, ozone, nitrous oxide, etc. Silicon nitride thin films can be grown using a silicon precursor and e.g. ammonia or nitrogen gas as a nitrogen precursor.

In yet another configuration, particle surface may be pre-oxidized either during the gas phase synthesis by introducing an oxidizing gas into the reaction chamber or during the ink formation/dispersion step. In general, oxidation of particles can be controlled by varying the molecular capping type and the density of molecular coverage of the nanoparticle surfaces suitable for appropriate ink dispersion. For example, having functionalization chemistry of the type Si—O-R, where the R-group portion may be removed by sintering the deposited ink to form a densified film, can leave behind an oxidized surface. The amount of oxygen left behind can be controlled by the degree of capping. A subsequent sintering step may also be utilized to densify the film and to activate the dopants.

In particular embodiments, a thin oxide layer may be provided on a wafer surface prior to silicon nanoparticle ink deposition, in order to reduce recombination of minority carriers at the wafer/film interface.

Figure 2:
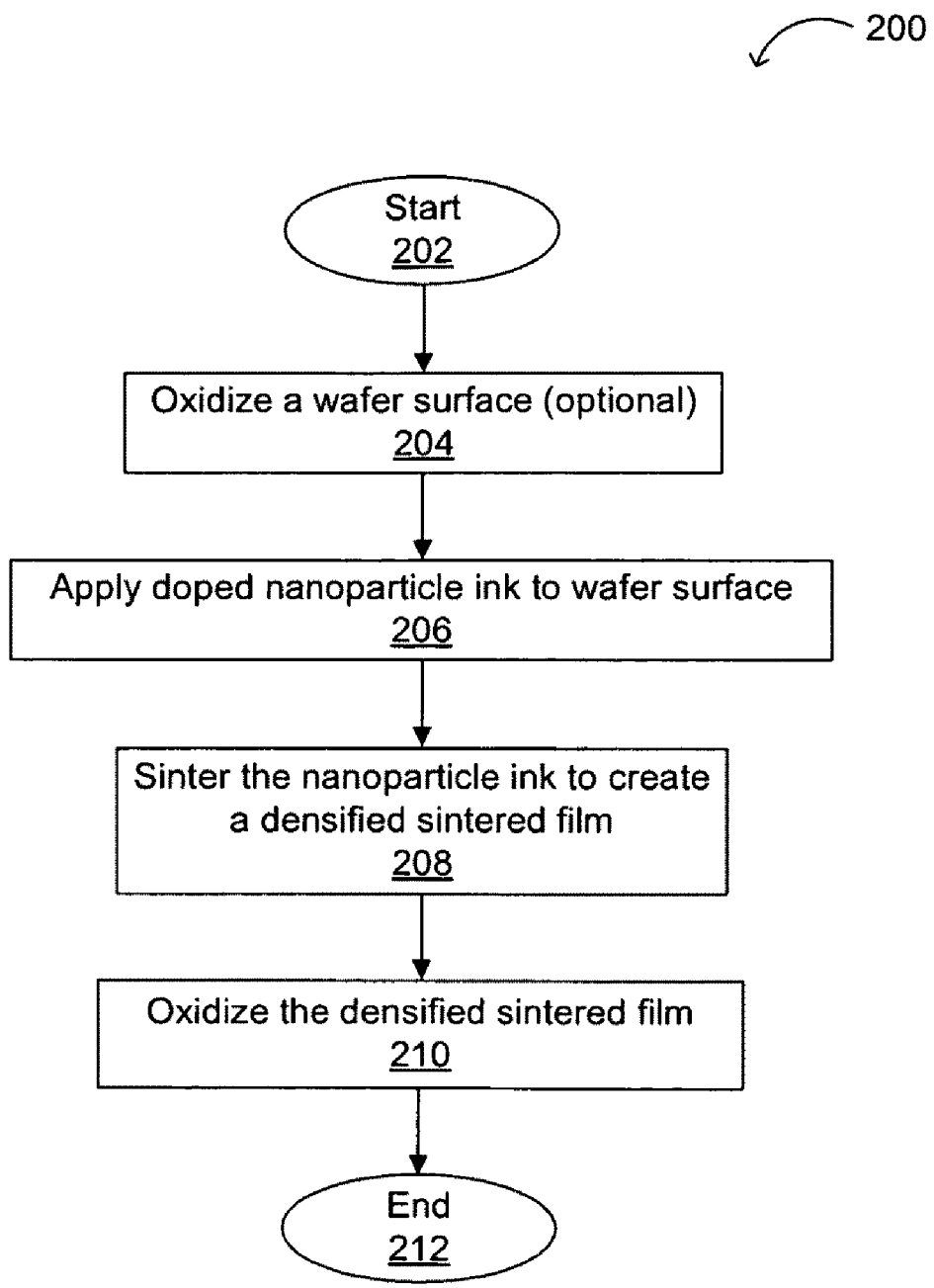
FIG. 2 shows a flow diagram of an example method of forming an emitter in accordance with embodiments of the present invention.

Referring now to FIG. 2, a flow diagram of an example method 200 of forming an emitter in accordance with embodiments of the present invention is shown. The flow begins 202, and doped nanoparticle ink can be applied to a wafer surface (206). Optionally, the wafer surface may be oxidized prior to the ink deposition using one of the approaches described above (204). The nanoparticle ink can be sintered to create a sintered densified nanoparticle film (208). The sintered film can then be oxidized using, e.g., thermal oxidation, to a desired degree (210). Once the desired degree of oxidation is achieved, the flow completes 212.

In this fashion, printable and tunable-band gap emitters, suitable for solar cell applications, can be provided. By adjusting or tuning a nanocrystal or nanoparticle size, the band gap of nanoparticle material can be effectively changed. There are several ways of changing particle size. For example, particle size can be modified by changing the particle synthesis conditions, such as pressure, power, gas flows, etc., or even changing the reactor geometry. Another approach involves changing particle size after synthesis by, e.g., an etching technique. Further, charge confinement effects may start to be significant at a particle diameter of less than about 5-6 nm. Thus, by using silicon nanoparticles with variable particle sizes below about 6 nm, variable band gap materials can be created. These materials can be used as emitters and/or BSFs in solar cells when appropriately doped to increase conductivity and adjust the Fermi level.

EXAMPLE 1

In a first example, referring now to FIG. 3A-D, a set of simplified figures illustrate the effect of a surface passivation in a p-type nanoparticle thin film as a result of post-sinter oxidation, in accordance with the invention.

In this example, p-doped silicon nanoparticle ink was spin coated on either a quartz substrate or n-type 1-5 Ohm-cm silicon wafer substrate to form a 400 nm thick film and subsequently the samples were annealed on a hot plate at about 100° C. for about 30 minutes inside a nitrogen-filled glove box. Subsequently the samples were placed on a susceptor in a rapid thermal processing (RTP) tool.

Figure 3A:
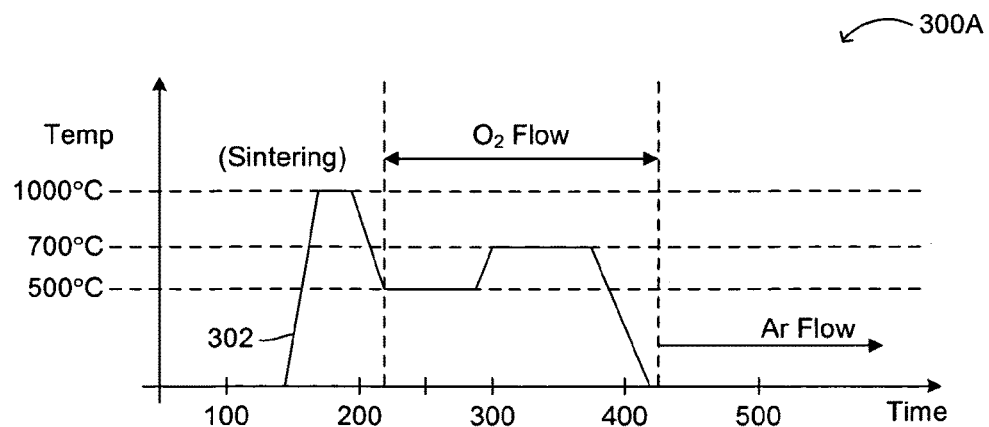
FIGS. 3A-D show characteristics of an example p+ emitter formed on an n-type wafer in accordance with embodiments of the present invention.

FIG. 3A shows an example simplified process temperature profile 300A of a surface passivation process described below. In process flow 302, after an initial argon chamber purge for about 120 seconds at a gas flow of 5 slpm (standard liters per minute), argon gas flow was turned off and the nanoparticle film was sintered by rapidly increasing the temperature to about 1000° C., holding for about 20 seconds followed by a cool-down to about 500° C., in order to form a densified nanoparticle film. As the sintering part of the process may be performed in argon ambient, no significant oxidation generally occurs.

At this point, the sintering is mostly complete and the oxidation of the internal surfaces can take place. Here, the oxidation was accomplished by starting oxygen flow of 3 slpm into the chamber with the densified thin film being maintained at about 500° C. After an initial hold time of 60 seconds, the temperature of the sample was increased (in this case) to about 1000° C., and held for about 30 seconds, followed by a cool-down to room temperature. In general, other lower oxidation temperatures are possible as shown in subsequent figures.

During this second step of the process, the internal surfaces can be oxidized with the oxide thickness dependent on the time and temperature of the oxidation step. As the oxidation temperature increases, so does the thickness of the oxide layer and the passivation quality. Similarly, the thickness of the oxide layer may increase with the duration of the oxidation step. Typical silicon oxidation conditions span the temperatures of from about 600° C. to about 1200° C., with duration varying from seconds to hours depending on the quality and thickness of the desired oxide layer. For example, an oxidation time at about 30 seconds, and at about 1000° C., can produce an oxide layer of approximately 4 nm thick on a planar surface.

Alternatively, the passivation (e.g., oxidation) process can be performed substantially during the sintering process. In this case, a predetermined amount of oxygen can be introduced at any stage during the sintering process (e.g., prior to about 200 seconds).

Figure 3B:
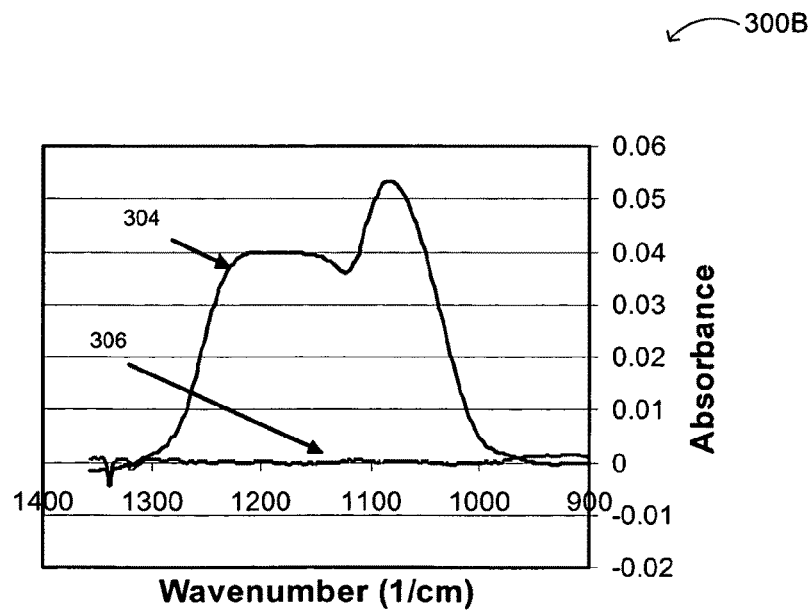

Referring to FIG. 3B, a Fourier Transform Infrared (FTIR) absorption spectrum 300B is shown for the densified thin film of FIG. 3A, prepared on a silicon wafer substrate. Here, spectrum (304) shows a clear silicon oxide peak centered between about 1000 cm$^{-1}$ and about 1300 cm$^{-1}$. For the samples that only experienced the sintering step without the oxide growth, the measured spectrum shows no such peak (306). Further, performing hydrofluoric (HF) acid etching of the oxidized film can result in disappearance of the oxide peak in the FTIR absorption spectrum, thus confirming the formation of silicon oxide layer on exposed surfaces upon oxidation.

Figure 3C:
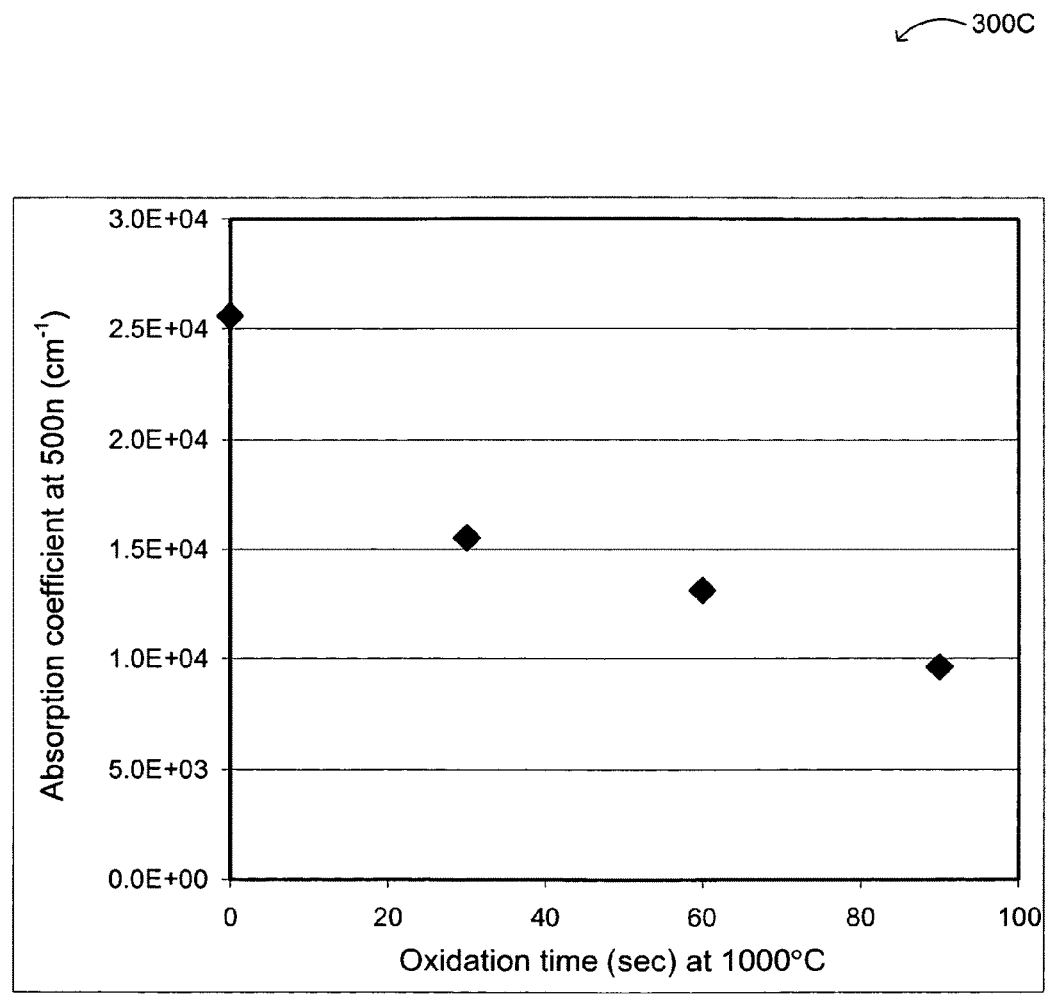

Referring now to FIG. 3C, a variation of the optical absorption coefficient of the nanoparticle film, measured at a wavelength of 500 nm, is shown (300C) as a function of the oxidation time, which was varied from about 0 seconds to about 90 seconds. In accordance with FIG. 3A, the sintering and oxidation were both performed at about 1000° C. As shown in FIG. 3C, the absorption coefficient decreases with increasing oxidation duration, which is indicative of the oxidation happening inside the pores of the film whereby light-absorbing silicon is being transformed to the silicon oxide phase, and which is significantly more transparent at a light wavelength of about 500 nm, as compared to the silicon phase. Significant changes of the absorption coefficient upon oxidation (e.g., the absorption coefficient is reduced by about a factor of 2 after about 60 seconds of oxidation) is indicative of a significant portion of silicon being converted to silicon oxide.

To ensure high solar cell device performance, a printed layer is expected to provide an adequate level of surface passivation when incorporated on the wafer. The passivation quality of the junction is generally characterized by its recombination current density, $J_0$. In general, better passivation quality translates to a lower value of $J_0$, which in turn is expected to yield a higher open circuit voltage, $V_{oc}$, of a corresponding solar cell, thus meaning higher solar cell efficiency. The parameter $J_0$ is generally extracted from the effective lifetime measurements, performed as a function of the generated minority carrier density, see, e.g. A. Cuevas and D. MacDonald, *Measuring and interpreting the lifetime of silicon wafers*, 76 SOLAR ENERGY 255 (2004).

Figure 3D:
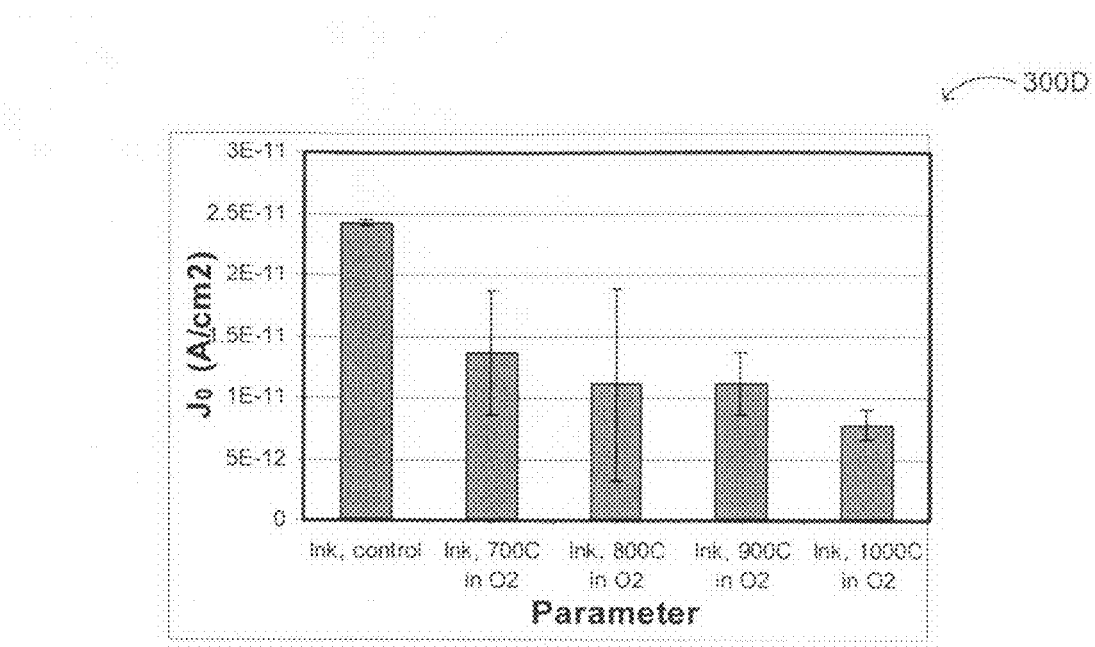

Referring now to FIG. 3D, a simplified diagram of the effect of oxidation of the sintered nanoparticles film on its recombination current density ($J_0$) is shown (300D). In accordance with this figure, recombination current density decreases with increasing degree of oxidation, that is the oxidation temperature in this example. This is an indication of improving passivation quality with increased oxidation. Here, a p+ emitter was formed on an n-type wafer in accordance with the process shown in FIG. 3A. FIG. 3D shows a beneficial effect of the film oxidation on the passivation properties of the printed nanoparticles film. In accordance with FIG. 3D, the recombination current density $J_0$ can be reduced by up to about 3 times when oxidizing the film at about 1000° C. for about 30 seconds.

EXAMPLE 2

Figure 3E:
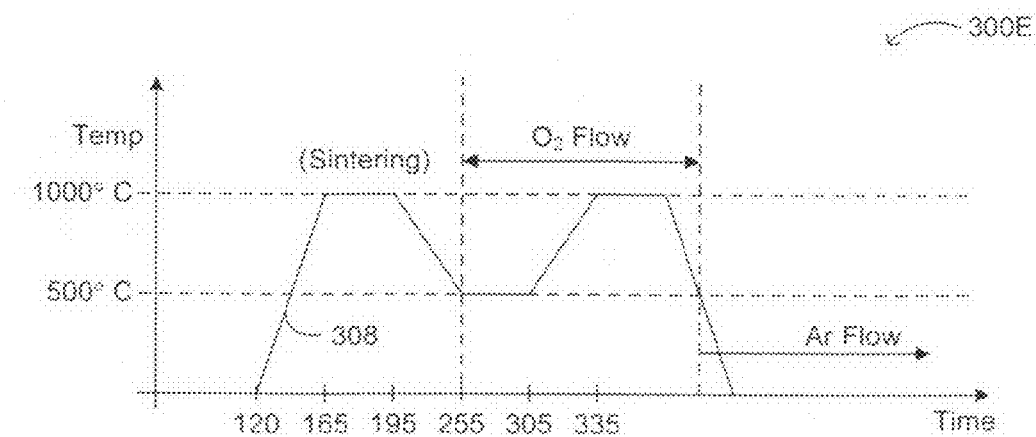
FIGS. 3E-G show characteristics of an example n+ emitter formed on a p-type wafer in accordance with embodiments of the present invention.
Figure 3F:
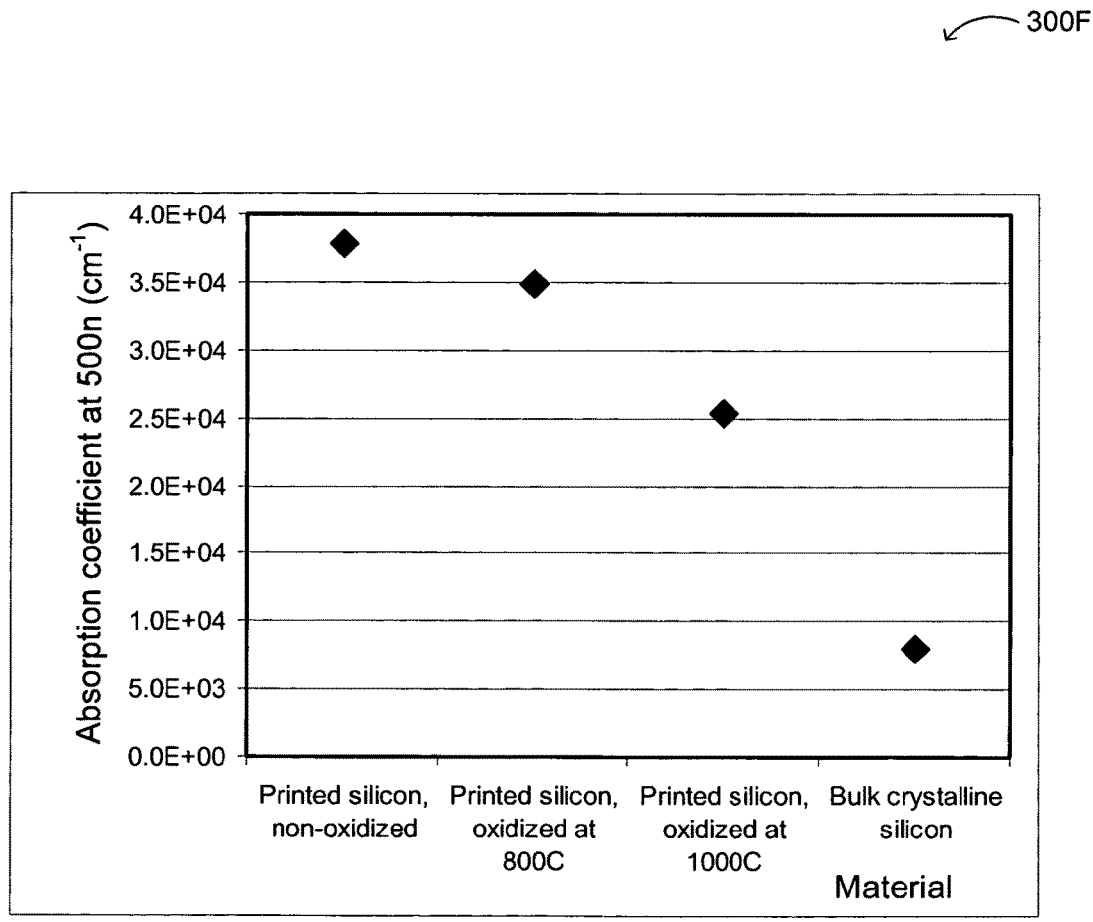
Figure 3G:
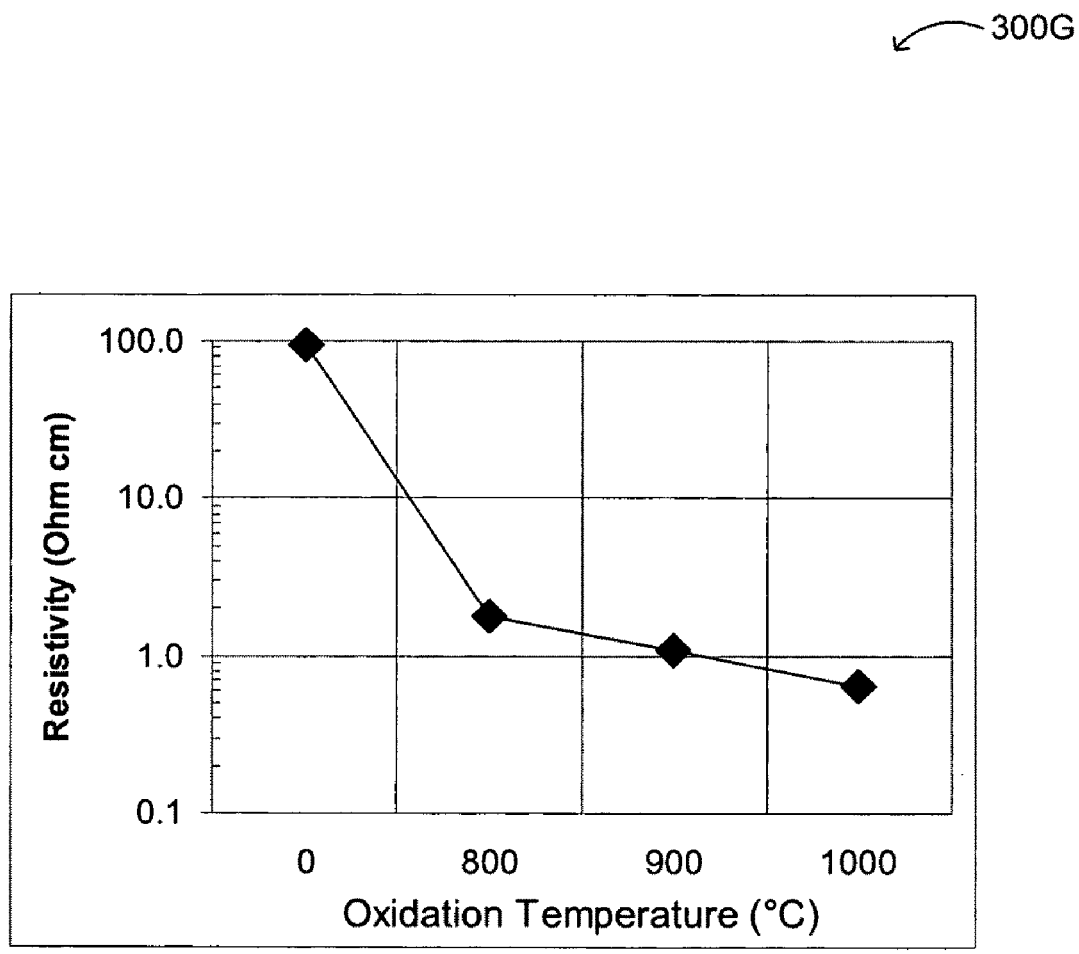

In a second example, referring now to FIGS. 3E-G, a set of simplified figures illustrate the effect of a surface passivation in an n-type nanoparticle thin film as a result of post-sinter oxidation, in accordance with the invention.

In this example, n-doped silicon nanoparticle ink was spin coated on either a quartz substrate or p-type 1-5 Ohm-cm silicon wafer substrate to form a 400 nm thick film, and subsequently the samples were annealed on a hot plate at about 100° C. for about 30 minutes inside the nitrogen filled glove box. Subsequently the samples were placed on a susceptor in a rapid thermal processing (RTP) tool.

FIG. 3E shows a simplified process temperature profile 300E of a surface passivation process. In process flow 308, after an initial argon chamber purge for about 120 seconds with a gas flow of 5 slpm, argon gas flow was turned off and the nanoparticle film was sintered by increasing the temperature to about 1000° C., holding for about 30 seconds, followed by a cool-down to about 500° C., in order to form a densified nanoparticle film. Similar to the process discussed above, as the sintering part of the process may be performed in argon ambient, no significant oxidation generally occurs.

At this point, the sintering is mostly complete and the oxidation of the internal surfaces can take place. Here, the oxidation was accomplished by starting oxygen flow of 3 slpm into the chamber with the densified thin film being maintained at about 500° C. After an initial hold time of about 60 seconds, the temperature of the sample was increased (in this case) to about 1000° C., and held for about 30 seconds, followed by a cool-down to room temperature. In general, other lower oxidation temperatures are possible as shown in subsequent figures.

During this second step of the process, the internal surfaces can be oxidized with the oxide thickness dependent on the time and temperature of the oxidation step. As the oxidation temperature increases, so does the thickness of the oxide layer and the passivation quality. Similarly, the thickness of the oxide layer may increase with the duration of the oxidation step. Typical silicon oxidation conditions span the temperatures of from about 600° C. to about 1200° C., with duration varying from seconds to hours depending on the quality and thickness of the desired oxide layer. For example, an oxidation time at about 30 seconds, and at about 1000° C., can produce an oxide layer of about 4 nm thick on a planar surface.

Alternatively, the passivation (e.g., oxidation) process can be performed substantially during the sintering process. In this case, a predetermined amount of oxygen can be introduced during the sintering process (e.g., prior to about 255 seconds).

Referring now to FIG. 3F, a variation of the optical absorption coefficient of the n-type nanoparticle film, measured at a wavelength of 500 nm, is shown 300F as a function of the oxidation temperature, which was varied between about 800° C. and about 1000° C. In accordance with FIG. 3E, the sintering and oxidation were each performed for a duration of about 30 seconds. As shown, the absorption coefficient decreases with increasing oxidation temperature, which is indicative of the oxidation happening inside the pores of the film whereby light-absorbing silicon is being transformed to the silicon oxide phase, and which is significantly more transparent at a light wavelength of about 500 nm, as compared to the silicon phase. Significant changes of the absorption coefficient upon oxidation (e.g., the absorption coefficient is reduced by about a factor of 1.5 after about a 30 second oxidation at about 1000° C.) may thus be indicative of a significant portion of silicon being converted to silicon oxide.

In general, the oxidation process described above can have a significant impact on the resistivity and optical absorption of the sintered Si film, as shown in the resistivity diagram of FIG. 3G (300G). Here, the silicon film resistivity, as measured by the four-point-probe method, is shown as a function of the oxidation temperature. As the oxidation temperature increases to about 1000° C., the oxide thickness and surface passivation quality increases, reducing the film resistivity by approximately 1000×, when compared to the film that did not go through the oxidation process. Such a significant impact of the oxidation process on the resistivity of the film is indicative of the oxidation happening inside the film pores and across the whole film thickness, thus affecting the bulk property of the film.

The examples presented above illustrate how the properties of the printed nanoparticles films can be effectively modified by performing oxidation across the whole film thickness, owing to the porosity of the film. Such processing can result in reduced recombination, improved conducting properties, and reduced optical absorption of the film.

In addition to exposed areas being passivated with a thermal oxide, the band gap of the film material can also be increased. Further, the oxidation can be controlled in particular embodiments to maintain sufficient contact area between the wafer and the applied silicon layer in order to allow current flow, yet suppress recombination effects. Also, oxidized nanoparticle ink layers can be used in any number of solar cell configurations (e.g., point junctions, all back contacts, etc.). See U.S. patent application Ser. No. 12/029,838 for more details on various solar cell structures involving nanoparticle inks.

In particular embodiments, an oxygen-rich layer of nanoparticle silicon that is doped to a high-level (p-type or n-type) can be used to passivate a wafer. Without passivation, substantial recombination, which may be proportional to an unpassivated area at a wafer surface interface, can occur. The layer can be coated as a nanoparticle ink by using ink-jet, spray-coating, draw-bar, or other methods applicable for ink deposition. For example, the layer can be deposited with a relatively high oxygen level, or oxygen may be introduced during processing to create a material with a wider band gap than silicon. Optionally, a thin oxide layer may be prepared on a wafer surface prior to depositing the ink layer. Such an ink layer can be created at sufficiently low temperatures such that the dopants may not be fully activated and thus the film would have a very low conductivity. Then, "points" or portions of the film may be cured with a laser, where the targeted portions of the film under the laser (e.g., including the dopant) can mix in the wafer and provide a point contact. Such a contact can be a junction, a BSF, an ohmic contact, etc., depending on the particular structure. In this fashion, the only patterning step may be the laser process, which can then be followed by an ink-jetting/screen-printing of a metallic portion, electrode plating, etc.

EXAMPLE 3

Figure 4A:
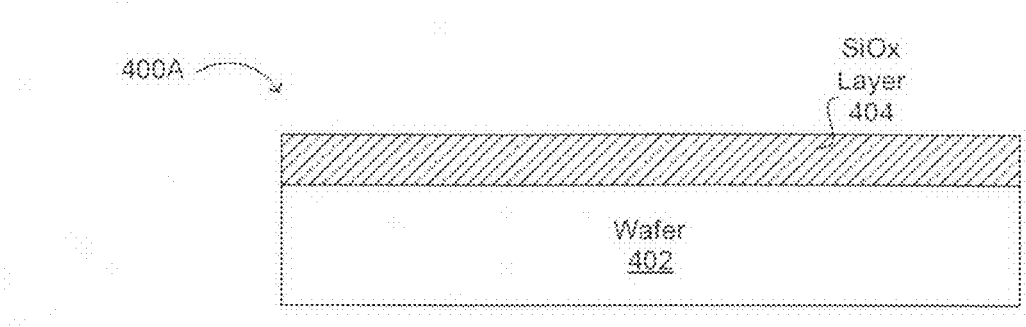
FIGS. 4A-B show cross-section diagrams of an example process flow for creating point contacts and a passivation layer in accordance with embodiments of the present invention.
Figure 4B:
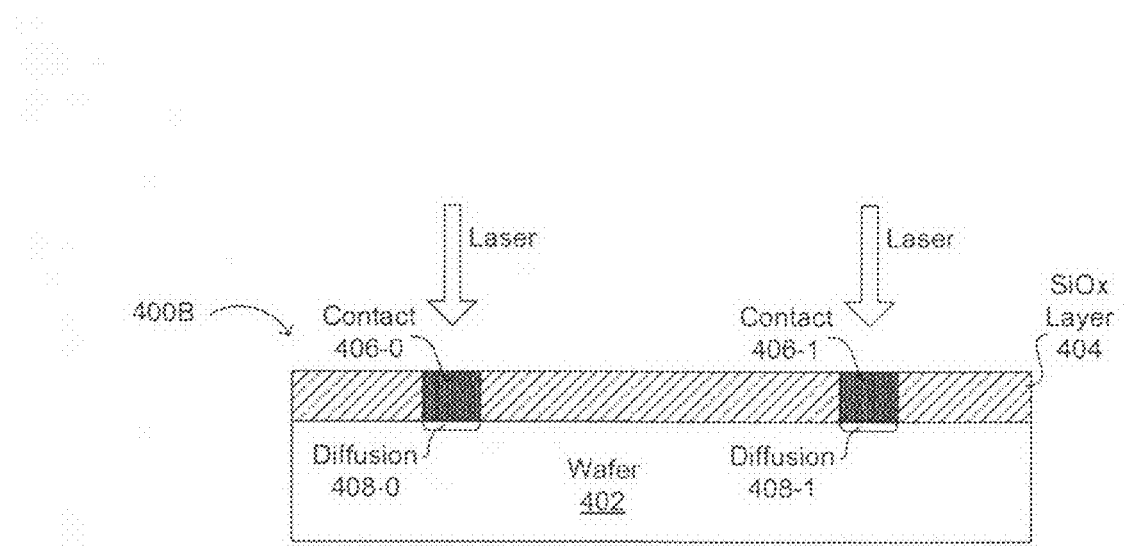

Referring now to FIGS. 4A-4B, shown are cross-section diagrams of an example process flow for creating point contacts and a passivation layer in accordance with embodiments of the present invention. In FIG. 4A (400A), a $SiO_x$ layer 404 can be formed on wafer 402, where x is an integer greater than zero. For example, a nanoparticle ink that either contains oxygen prior to printing, or an ink that is deposited, sintered and then oxidized (e.g., thermal oxidation), can be used in certain embodiments. Alternatively sintering and oxidation can be done simultaneously. Optionally, prior to the ink layer deposition, a thin oxide layer may be formed, e.g., by thermal oxidation or CVD.

In the particular example of FIG. 4B (400B), a laser can be used to fire regions of $SiO_x$ layer 404 to form point contacts 406-0 and 406-1. During this process, dopants contained in $SiO_x$ layer 404 can penetrate into wafer 402 to form diffusion regions 408-0 and 408-1, and may also result in some melting of the $SiO_x$, and Si material. Accordingly, point contact structures can be fabricated while employing $SiO_x$, as a passivation layer. Further, subsequent process can include forming a metallization layer for other connections (e.g., electrode, BSF, etc.) to the point contacts.

In this fashion, an improved interface and/or a higher band gap material, relative to other approaches, can be formed in certain embodiments. Point contacts, which can be used for localized emitter connections (e.g., in solar cell applications) that include many relatively small connections, as opposed to one or two relatively large connections, can effectively reduce an overall recombination density ($J_0$), thereby also increasing an open circuit voltage (Voc). For example, point contacts may have a $J_0$ of about $10^{-12}$, while the passivation material (e.g., $SiO_x$), which can cover a substantial surface area of the wafer, may have a $J_0$ of about $10^{-13}$. As a result, an effective $J_0$ of about $10^{-13}$ $J_0$ for a wafer with relatively good carrier lifetimes can be achieved.

Figure 5:
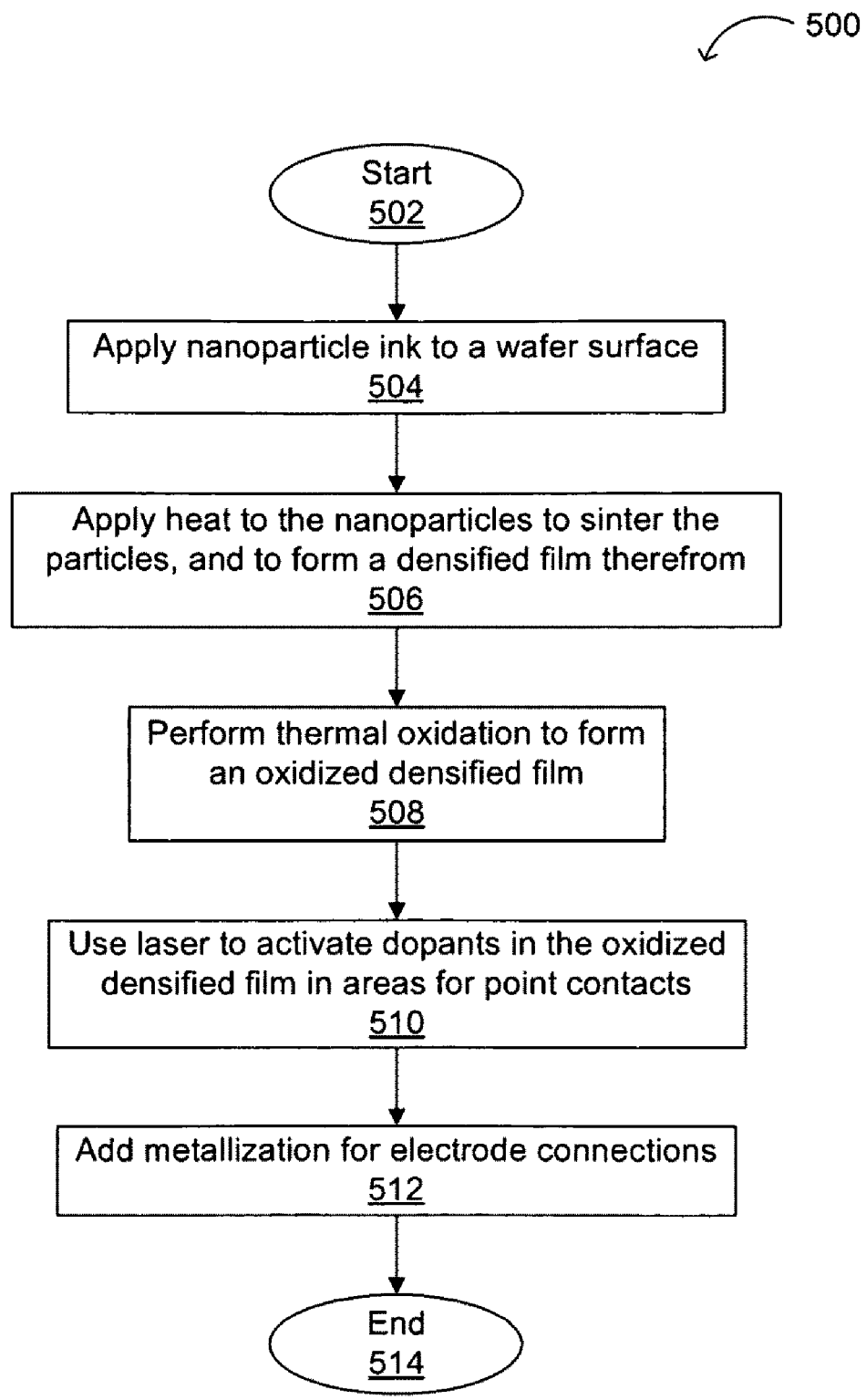
FIG. 5 shows a flow diagram of an example method of making a point contact in accordance with embodiments of the present invention.

Referring now to FIG. 5, shown is a flow diagram of an example method 500 of making a point contact in accordance with embodiments of the present invention. The flow begins 502, and a nanoparticle ink (e.g., containing silicon nanoparticles) can be deposited (e.g., printed) on a wafer surface (504). Optionally, a thin oxide layer can be formed on the wafer surface prior to the nanoparticle ink deposition, as discussed above. Heat may generally be applied to the printed nanoparticle ink in order to sinter the printed ink material, and to form a densified nanoparticle film (506). This densified film can also be made to contain oxygen as a result of thermal oxidation (508), or any other suitable oxidation method (e.g., prior to ink deposition).

In order to create conductivity by activating dopants found in the densified film, a higher temperature step than that required for the sintering would need to be performed. For example, sintering may take place at temperatures in a range of from about 600° C. to about 700° C., whereas dopant activation can occur at temperatures in a range of from about 800° C. to about 1000° C. In particular embodiments, a laser, or other suitable localized heating apparatus, can then be used to locally activate dopants in the densified film in areas for point contacts (510). Metallization for electrode connections can then be added over the point contacts (512), completing the flow 514.

In this fashion, oxygenated silicon ($SiO_x$) can create good passivation with relatively low conductivity material. A laser can then be used in a heating step to activate dopants in regions targeted by the laser. If emitters (e.g., in a solar cell application) are being formed, a dopant type may be different than that of wafer 402 (e.g., an n-type dopant for a p-type wafer). However, for BSF formation (e.g., in a solar cell application), a same type dopant as that of wafer 402 (e.g., a p-type dopant for a p-type wafer) can be used.

EXAMPLE 4

In a fourth example, a passivated densified nanoparticle thin film is generated in a CVD chamber. In this example, a nanoparticle ink was deposited on a first region on the substrate in, the nanoparticle ink including a set of Group IV semiconductor particles and a solvent. The nanoparticle ink is then heated between about 30° C. and about 400° C., and for between about 1 minute and about 60 minutes, in order to substantially remove the solvent and form a porous compact. The porous compact is then heated between about 600° C. and about 1000° C., and for a between about 5 seconds and about 1 hour. A set of precursor gases are then flowed into the CVD chamber at between about 300° C. and about 1000° C., and between about 1 second and about 1 hour, in order to form a passivated densified nanoparticle thin film. In general, the set of precursor gases may include silane and at least one of oxygen, nitrous oxide, nitrogen monoxide, and carbon dioxide, or alternatively tetraethooxysilane and at least one of oxygen and ozone.

In addition, a passivation layer, such as $SiN_x$, can be used to reduce recombination velocity at wafer surfaces, where x is an integer greater than zero. Surface recombination may lead to a reduction in extracted current in solar cell applications. Typically, a good surface passivating $SiN_x$ may be deposited via a chemical vapor deposition (CVD) process. However, such CVD processes are relatively expensive in terms of capital costs and deposition time.

In particular configurations, $SiN_x$ nanoparticles can be deposited by printing (e.g., via ink-jetting) a $SiN_x$ ink on a wafer surface. The $SiN_x$ ink can be printed, and then sintered to form a $SiN_x$ passivation layer on the wafer surface. Further, point contacts in particular embodiments can be formed by printing using a negative of the passivation layer pattern. Printing $SiN_x$ ink can fill exposed wafer surfaces substantially to an edge of the point contacts. Then, sintering of the point contact and passivation inks can occur. Thus in certain embodiments, $SiN_x$ nanoparticles can be sintered to form a passivation layer.

Due to the covalent bonding of Si and N in $SiN_x$ bulk films, melting may not be seen at a single atmosphere of pressure. At about 1900° C., $SiN_x$ can experience sublimation transforming into the gaseous phase, and bypassing the liquid phase. Applying high pressures to the bulk $SiN_x$ film can allow the film to melt, thus allowing a liquid phase. In contrast, due to the discrete nature of $SiN_x$ nanoparticles, lower temperature sintering may be observed. For example, high density green $SiN_x$ compacts have been shown to sinter to higher than about 90% density at about 1000° C. for about 10 nm sized $SiN_x$ nanoparticles.

Figure 6A:
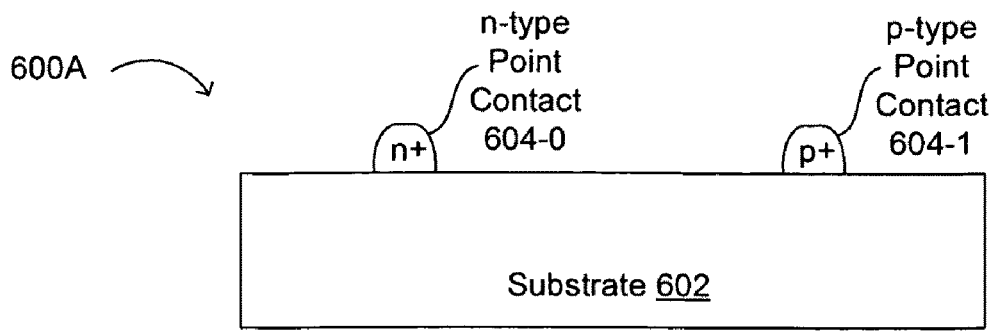
FIGS. 6A-C show cross-section diagrams of a first example point contact and passivation layer formation in accordance with embodiments of the present invention.
Figure 6B:
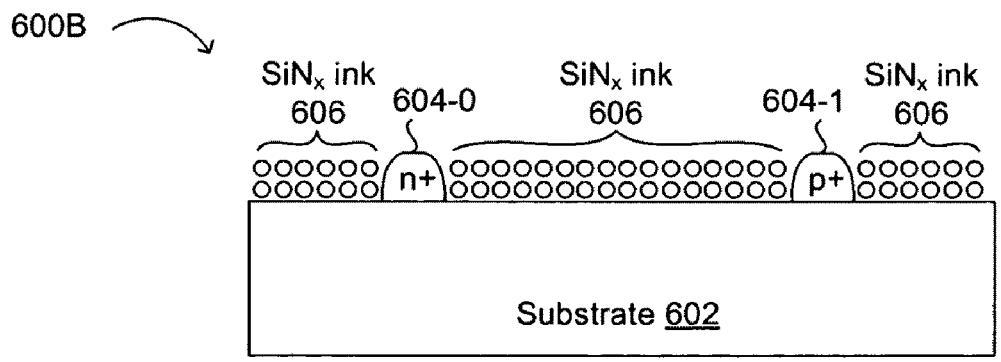
Figure 6C:
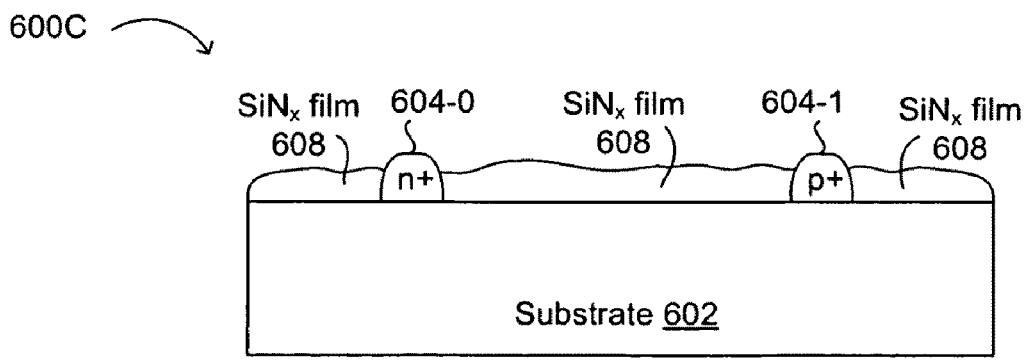

Referring now to FIGS. 6A-6C, shown are cross-section diagrams of a first example point contact and passivation layer formation in accordance with embodiments of the present invention. In FIG. 6A (600A), n-type point contact 604-0 and p-type point contact 604-1 can be formed on wafer substrate 602. Alternatively, point contact 604-1 can be doped n-type. In FIG. 6B (600B), SiN$_x$ nanoparticle ink 606 can be printed on substrate 602 in regions between point contacts 604-0 and 604-1. In FIG. 6C (600C), densified SiN$_x$ nanoparticle film 608 can be formed from the printed SiN$_x$ ink by "firing" or sintering the ink.

In this fashion, a reduced J$_0$ with increased current extraction and carrier lifetime in a solar cell application can be achieved by the passivation effects of SiN$_x$ film 608. Further, the firing/sintering step (e.g., at about 750° C. to 850° C. in a furnace for from about 1 second to about 60 seconds) can essentially force hydrogen (H) (e.g., derived from a carrier gas for ammonia and silane, which are dissociated) into wafer substrate 602. For example, such diffused H can reduce defects by bonding with dangling bonds or crystallographic defects at interfaces between SiN$_x$ and Si, passivate out oxygen thermal donors and other impurities, and increase carrier lifetimes. In particular embodiments, SiN$_x$ film 608, as well as an anti-reflective coating thereon, has a thickness of about 70 nm, for an index of refraction in a range of from about 1.9 to about 2.2.

Figure 7A:
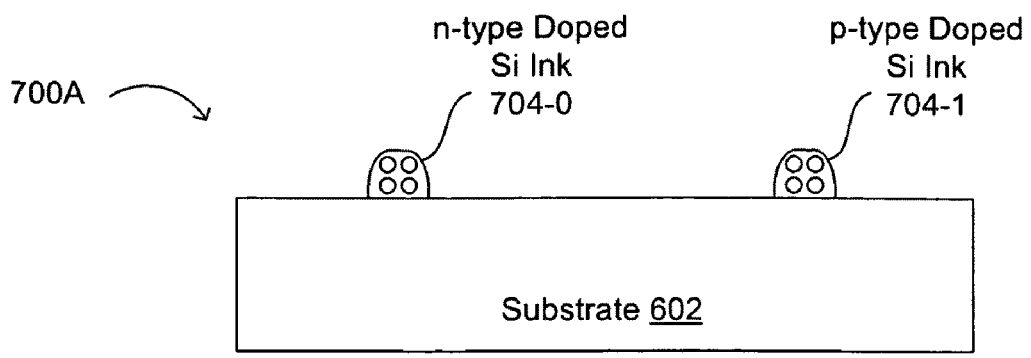
FIGS. 7A-C show cross-section diagrams of a second example point contact and passivation layer formation in accordance with embodiments of the present invention.
Figure 7B:
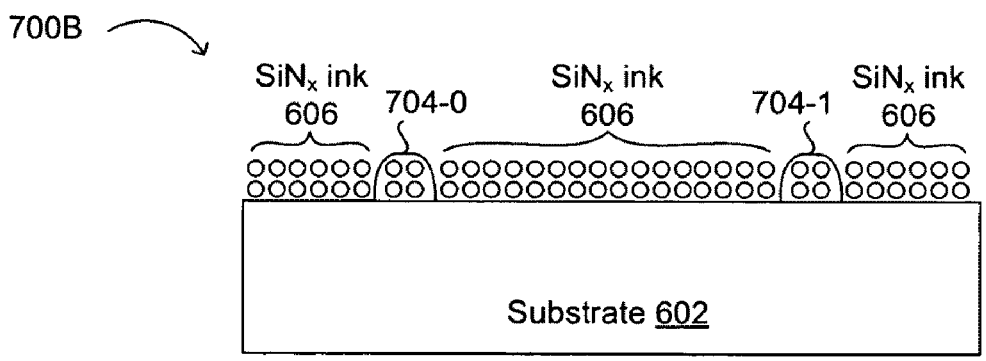
Figure 7C:
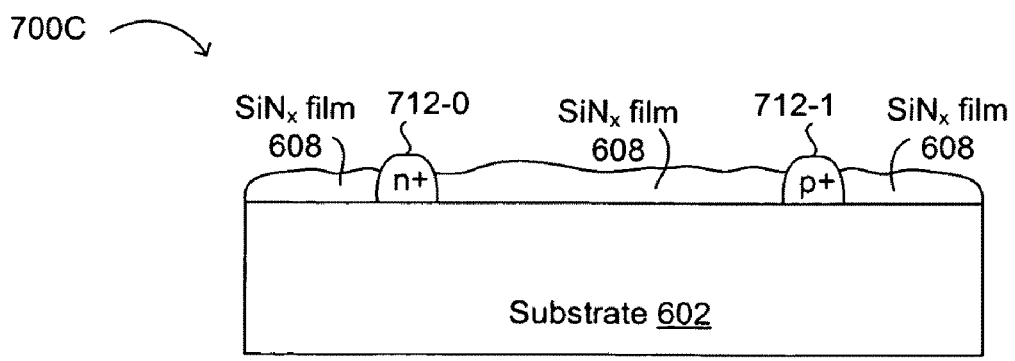

Referring now to FIGS. 7A-7C, shown are cross-section diagrams of a second example point contact and passivation layer formation in accordance with embodiments of the present invention. In FIG. 7A (700A), n-type doped silicon nanoparticle ink 704-0 and p-type silicon nanoparticle ink 704-1 can be printed in areas for point contacts on wafer substrate 602. Alternatively, point contact 704-1 can be doped n-type. In FIG. 7B (700B), SiN$_x$ nanoparticle ink 606 can be printed in areas for passivation on substrate 602 (e.g., surrounding point contacts 704-0 and 704-1). In FIG. 7C (700C), a heating step can take place for sintering inks 704-0, 704-1, and 606, to form corresponding densified films 712-0, 712-1, and 608. In this fashion, n-type point contact 712-0, p-type point contact 712-1, and passivation SiN$_x$ film 608, can be formed on the surface of wafer substrate 602.

Alternatively, doped nanoparticle inks can be printed in areas for point contacts 712-0 and 712-1, and solvents in the inks can be baked out to form a partially densified, more defined structure. This approach allows for more definition at the Si—SiN$_x$ interfaces, and substantial avoidance of mixed doped regions at interfaces between the point contacts (e.g., 712-0, 712-1) and SiN$_x$ passivation film 608. SiN$_x$ nanoparticle ink (e.g., 606) can then be printed on the wafer surface, followed by another baking step to remove solvents from the SiN$_x$ nanoparticle ink. Then, the printed inks can be sintered to form associated densified films (e.g., for passivation, point contacts, etc.). In this case, some dopants contained in the doped nanoparticle inks for point contacts can diffuse into the wafer below the point contacts, thus forming good ohmic contacts to substrate 602.

Figure 8:
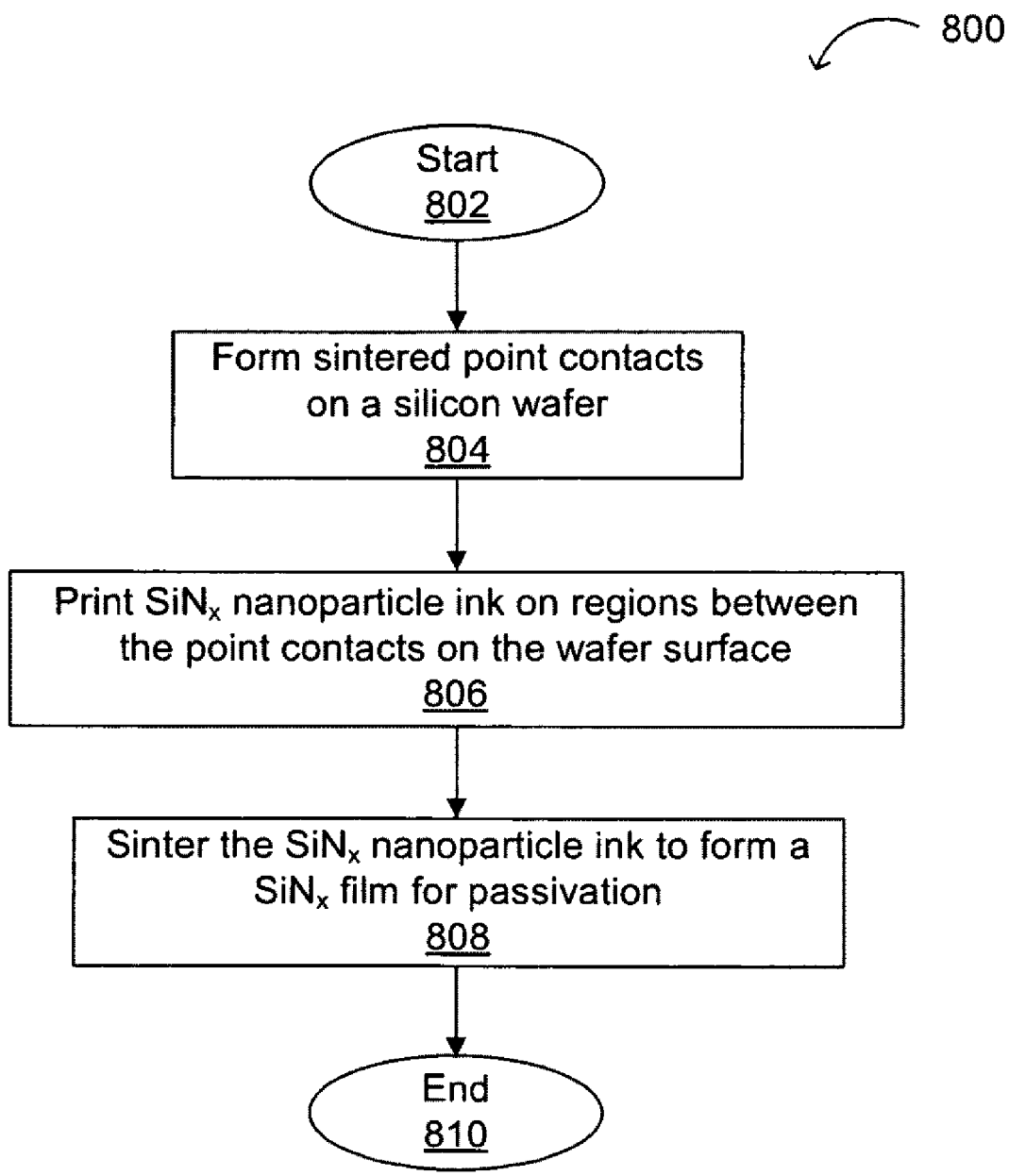
FIG. 8 shows a flow diagram of an example method of forming point contacts and a SiN$_x$ passivation in accordance with embodiments of the present invention.

Referring now to FIG. 8, shown is a flow diagram of an example method 800 of forming point contacts and a SiN$_x$ passivation in accordance with embodiments of the present invention. The flow begins 802, and sintered point contacts can be formed on a silicon wafer (804). SiN$_x$ nanoparticle ink can be printed on regions between the point contacts on the wafer surface (806). The SiN$_x$ nanoparticle ink can then be sintered to form a densified SiN$_x$ nanoparticle film for passivation (808), thus completing the flow 810. Alternatively, SiN$_x$ nanoparticles can be printed for the passivation areas prior to formation of the point contacts.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects. The substrate may include an oxide layer less than 2 nm in thickness.

The invention has been described with reference to various specific and illustrative embodiments. However, it should be understood that many variations and modifications may be made while remaining within the spirit and scope of the invention. Advantages of the invention methods method of forming a passivated densified nanoparticle thin film on a substrate Having disclosed exemplary embodiments and the best mode, modifications and variations may be made to the disclosed embodiments while remaining within the subject and spirit of the invention as defined by the following claims.

What is claimed is:

1. A method for forming a passivated densified nanoparticle thin film on a substrate in a chamber, comprising:
   depositing a nanoparticle ink on the substrate, the nanoparticle ink including a set of SiN$_x$ particles and a solvent;
   heating the nanoparticle ink to a first temperature between about 30° C. and about 400° C., and for a first time period between about 1 minute and about 60 minutes, wherein the solvent is substantially removed, and a porous compact is formed;
   heating the porous compact to a second temperature between about 600° C. and about 1000° C., and for a second time period of between about 5 seconds and about 1 hours;
   wherein the passivated densified nanoparticle thin film is formed.

2. The method of claim 1, wherein the nanoparticle ink and the substrate are both n-doped.

3. The method of claim 1, wherein the nanoparticle ink and the substrate are both p-doped.

4. The method of claim 1, wherein the nanoparticle ink is p-type doped and the substrate is n-doped.

5. The method of claim 1, wherein the nanoparticle ink is n-type doped and the substrate is p-doped.

6. The method of claim 1, wherein the step of heating the porous compact to a second temperature is performed with one of a laser, a RTP apparatus, a resistive heater, a batch furnace, and a belt furnace.

7. The method of claim 1, wherein the passivated densified nanoparticle thin film includes a set of passivated densified nanoparticle thin film surfaces, wherein a substantial portion of the passivated densified nanoparticle thin film surfaces are covered with a SiO$_x$ layer.

* * * * *